(12) United States Patent
Toffoli

(10) Patent No.: US 8,054,096 B2
(45) Date of Patent: Nov. 8, 2011

(54) DEVICE FOR MEASURING THICKNESS AND SQUARE RESISTIVITY OF INTERCONNECTING LINES

(75) Inventor: Alain Toffoli, Le Gua (FR)

(73) Assignee: Commissariat a l'Energie Atomique, Paris (FR)

(*) Notice: Subject to any disclaimer, the term of this patent is extended or adjusted under 35 U.S.C. 154(b) by 477 days.

(21) Appl. No.: 12/270,380

(22) Filed: Nov. 13, 2008

(65) Prior Publication Data

US 2009/0128183 A1    May 21, 2009

(30) Foreign Application Priority Data

Nov. 21, 2007 (FR) ...................... 07 59196

(51) Int. Cl.
*G01R 31/02* (2006.01)
*G01R 31/26* (2006.01)
*G01R 31/08* (2006.01)
(52) U.S. Cl. .................. 324/762.01; 324/525
(58) Field of Classification Search .......... None
See application file for complete search history.

(56) References Cited

U.S. PATENT DOCUMENTS

| 5,636,133 | A | 6/1997 | Chesebro et al. |
| 6,403,389 | B1 | 6/2002 | Chang et al. |
| 6,635,501 | B1 | 10/2003 | Rowland |

FOREIGN PATENT DOCUMENTS

| EP | 0 813 239 A1 | 12/1997 |
| EP | 0 825 644 A1 | 2/1998 |
| WO | 96/15552 A1 | 5/1996 |

OTHER PUBLICATIONS

Guillaumond et al; "Analysis of resistivity in nano-interconnect: Full range (4.2-300K) temperature characterization", Proc. of IITC 2003 conf., p. 132.
Van Der Pauw; "A Method of Measuring the Resistivity and Hall Coefficient on Lamellae of Arbitrary Shape", Philips Technical Revue, vol. 20, No. 8, 1958 pp. 230-233.
Federspiel et al; "Accurate Method for Determination of Interconnect Cross Section", 2005 IEEE, International Integrated Reliability Workshop 2005, pp. 133-134.
Van Der Pauw; "A Method of Measuring the Resistivity and Hall Coefficient on Lamellae of Arbitrary Shape", Philips Research Reports, vol. 13, No. 1, 1958, pp. 1-9.
French Preliminary Search Report.

*Primary Examiner* — Roberto Velez
(74) *Attorney, Agent, or Firm* — Pearne & Gordon LLP

(57) ABSTRACT

A microelectronic device comprising one or several metallic levels provided with one or several superposed metallic interconnecting levels and at least one test structure:
  at least one metallic zone formed in at least one insulating zone, the metallic zone comprising:
    at least one first metallic portion through which a current will be injected and at least one second metallic portion through which said current will be extracted,
    at least one third metallic portion that will act as a first voltage measurement point, and at least one fourth metallic portion that will act as a second measurement point for said voltage,
    a plurality of insulating islands incorporated in said metallic zone,
  said structure also comprising:
    a plurality of metallic islands incorporated in the insulating zone and distributed around said metallic zone.

7 Claims, 1 Drawing Sheet

DEVICE FOR MEASURING THICKNESS AND SQUARE RESISTIVITY OF INTERCONNECTING LINES

TECHNICAL DOMAIN

The invention relates to the field of microelectronics and particularly test structures in integrated circuits, designed for resistance and/or square resistance measurements, and/or thickness measurements of conducting lines.

It allows for the use of a test structure comprising a large metallic zone through which a current will pass and at the terminals of which a voltage will be measured, and means for preventing phenomena commonly called "dishing" and "erosion" on and around this metallic zone, and that lead to the formation of non-plane surfaces.

STATE OF PRIOR ART

Microelectronic devices usually include interconnections used to connect components and/or circuits to each other, in the form of horizontal metallic zones or metallic lines distributed on one or several levels and that extend in a direction parallel to the principal plane of a substrate on which said components are supported. Metallic elements connecting one or several metallic zones to each other are also provided to form contacts between the different levels of metallic lines.

For example, the metallic lines could be based on aluminium or copper, and are formed during process steps commonly called "Back-end" steps.

After the metallic lines have been produced, it might be necessary to measure the dimensions and/or physical parameters of these lines. It is usually required to measure the thickness and width of the lines, and some physical parameters such as the square resistance Rc:

$$Rc = \rho/e$$

where Rc is the square resistance of a line, ρ is the resistivity of the metallic material from which the line is made, and e is the thickness of the line.

Metallic lines using a "damascene" type process can be made particularly in sub-micronic technologies, in other words in which patterns are made with critical dimensions smaller than 1 μm. A metallic level can be formed using such a process by making one or several trenches in an insulating layer in advance and then filling them using a metal such as copper, then applying a mechanical-chemical polishing to eliminate a superfluous thickness of metal material and to obtain metallic lines with a plane and homogenous surface, so that a higher level can be stacked.

One disadvantage of this polishing step lies in the appearance of phenomena commonly called "dishing" and "erosion", that are due to non-homogenous shrinkage of the metallic material from which the lines are formed, or the insulating material depending on the ratio of the occupied surface between these materials.

FIG. 1A shows a metallic line 2 formed in a layer of insulating material 4, excavated by a "dishing" phenomenon. This phenomenon is induced by the fact that the surface occupied by this metallic line 2 is much larger than the surfaces occupied by the insulating material 4 surrounding this line.

FIG. 1B shows metallic lines 6 and 8 separated by a zone 7 of insulating material excavated by an "erosion" phenomenon. This phenomenon is due to the fact that the surface occupied by the insulating zone 7 is much larger than the surface occupied by the metallic lines 6 and 8 surrounding this zone.

For devices that have not been made using the mechanical-chemical polishing, square resistance measurements can be made using a structure with a Vanderpauw pattern like that described in document "A method for measuring the resistivity and Hall Coefficient on lamellae of arbitrary shape", Philips technical review 20: 220-224, 1954, and that can be used to extract the resistivity and the thickness.

Such a structure cannot be used for sub-micronic technologies. In order to obtain a precise measurement, the critical dimension of the measurement structure is preferably greater than several micrometres, for example 5 μm, which means that "dishing" effects will occur during its production. When a measurement is made, the result of such "dishing" effects is to make the value of the square resistance measured on the test structure greater than the square resistance of the real interconnecting metallic lines that are not affected by a "dishing" effect due to their smaller critical dimension.

Another method of measuring the thickness of a metallic interconnecting line is described in the document entitled "Accurate method for determination of interconnect cross section", by X. Federspiel and Al. It consists of measuring the dimensions of a sample using a scanning electron microscope (SEM), and calculating the parameters of other devices using this sample as reference. One disadvantage of this method is that it requires the use of expensive equipment and is incompatible with speed requirements inherent to industrial manufacturing processes.

The problem that arises is to find a new process for measuring the thickness and/or square resistance of metallic lines that does not include the disadvantages mentioned above.

PRESENTATION OF THE INVENTION

Firstly, the invention relates to a microelectronic device provided with one or several superposed metallic interconnecting levels and at least one test structure comprising:
- at least one metallic zone formed in at least one insulating zone, the metallic zone comprising:
  - at least one first metallic portion through which a current is intended to be injected and at least one second metallic portion through which said current is intended to be extracted,
  - at least one third metallic portion that is intended to act as a first voltage measurement point, and at least one fourth metallic portion that is intended to act as a second measurement point for said voltage, a plurality of insulating islands being incorporated in said metallic zone, said structure also comprising:
- a plurality of metallic islands incorporated in the insulating zone and distributed around said metallic zone.

The invention also overcomes the effects of "dishing" and "erosion" due to chemical-mechanical polishing (CMP), so that the thickness and square resistance measured on this structure are the same as interconnecting lines in the circuits.

The number and size of metallic islands may be selected at least as a function of the total surface area occupied by the metallic zone and the number and size of insulating islands made of a dielectric material.

The number and size of metallic islands may be selected at least as a function of the area and geometry of the zone of dielectric material, so as to balance areas of the metallic material and the dielectric material. The number and size of islands of dielectric material may also be selected at least as a function of the area and the geometry occupied by the metallic material zone, so as to balance areas of the metallic material and the dielectric material.

The metallic and insulating islands are selected so as to balance the areas of the metallic and insulating materials.

The metallic and insulating islands are used to balance the area of metallic material and dielectric material within the insulating zone.

The number and size of metallic islands and insulating islands may be selected such that the area of dielectric material and the area of metallic material within the insulating zone are equal or less than 10% different from each other.

The area of the insulating zone may be between 1.5 times and 2.5 times the area of the metallic zone.

The insulating zone may surround the metallic area and its area may be about twice as large as the area of the metallic zone.

A diffusion barrier layer may be provided around the metallic islands and/or the insulating islands and/or said metallic zone. Such a diffusion barrier prevents the diffusion of metal in the dielectric material.

The invention also relates to a method for measuring resistance and/or square resistance using a structure like that defined above.

The invention also relates to a method for estimating the thickness of at least one metallic interconnecting line in which:
at least one first square resistance measurement is made at a first temperature using a structure like that defined above, integrated into a microelectronic device comprising said interconnecting line of a microelectronic device comprising said metallic line,
at least one second square resistance measurement at a second temperature different from said first temperature and using said structure.

The invention can give measurements more easily and more quickly compatible with electrical tests currently being carried out during and after manufacturing of microelectronic circuits.

BRIEF DESCRIPTION OF THE DRAWINGS

This invention will be better understood after reading the description of example embodiments that is given purely for information and is in no way limitative with reference to the appended drawings in which.

DETAILED PRESENTATION OF PARTICULAR EMBODIMENTS

Figure 1A:
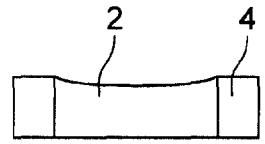
FIGS. 1A-1B show phenomena commonly referred to as "dishing" and "erosion" during manufacturing of metallic interconnecting lines using a Damascène process.
Figure 1B:
Figure 2:
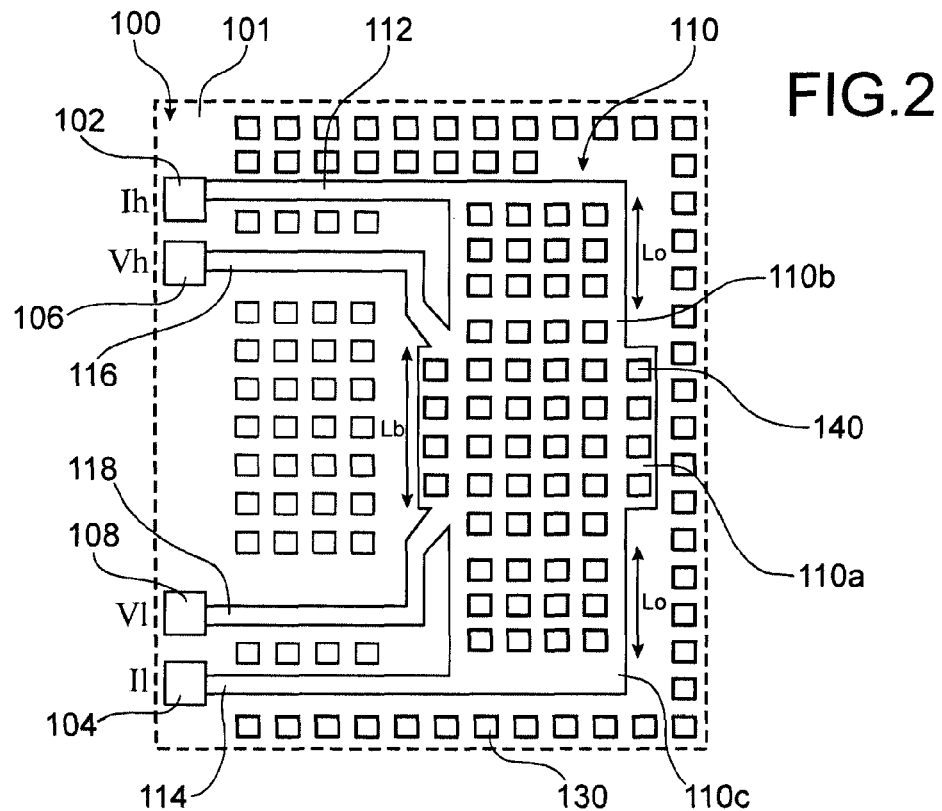
FIG. 2 shows an example of a test structure in a microelectronic device according to the invention.

We will now describe one example microelectronic device provided with a test structure according to the invention, with reference to FIG. 2.

This structure is formed on a substrate on which a plurality of components and interconnecting lines between components are also made.

The test structure comprises a metallic zone 110 connected to conducting pads 102, 104, 106, 108, the metallic zone and the pads being inserted in an insulating zone 100.

The insulating zone 100 may be a region of a dielectric material layer 101 or it may be derived from a dielectric material layer 101, for example such as $SiO_2$.

The insulating zone 100 may have an area for example between 1.5 times and 2.5 times the area occupied by the metallic zone 110, for example of the order of twice the area occupied by the metallic zone.

A first conducting pad 102 is connected to a first metallic portion 112 of the metallic zone 110 and is designed to carry a first current acting as a test current, for example within the range 0.1 mA to 10 mA.

A second conducting pad 104 is connected to a second metallic portion 114 of the metallic zone 110 and is designed to carry said test current.

A third conducting pad 106 is connected to a third metallic portion 116 of the metallic zone 110 and is designed to act as a high measurement point for a voltage, while a fourth conducting pad 108 is connected to a fourth metallic portion 118 of the metallic zone and forms a low measurement point of said voltage.

The metallic portions 112, 114, 116, 118, may be in the form of metallic tracks or strips.

The metallic zone 110 may also comprise a central part 110a that may for example be rectangular or square, and to which the third and fourth metallic portions 116, 118 provided for the voltage measurement are connected.

The metallic zone 110 may also be provided with a second part and a third part 110b, 110c on each side of the central part 110a, for example rectangular or square in shape, and to which the third and fourth metallic portions 116, 118 are connected.

The central part 110a of the metallic zone 110 may be wider than the central part of the second and third parts 110b, 110c. This may be designed so as to integrate connections specific to the voltage measurement.

The length Lo of the parts 110b and 110c must be at least 5 times greater than the length Lb of the part 110a, to enable circulation of the current uniformly in part 110a.

Metallic elements that will be called "dummies" are also formed in the dielectric material 101 of the insulating zone 100. These metallic elements are in the form of metallic islands 130, for example square in shape, and their purpose is particularly to balance quantities of areas of dielectric material 101 and metal inside the insulating zone 100 so as to overcome the previously described erosion phenomenon that occurs due to excessively large areas of dielectric material.

The metallic islands 130 are distributed in the insulating zone 100 around the metallic zone 110, and may for example be in the form of rectangular or square pads with a critical dimension or width $w_1$ for example between 240 nm and 600 nm, for example of the order of 480 nm. Some metallic islands may be located between the metallic portions 112, 114, 116, 118. The metallic islands 130 may be at a spacing between each other equal to a distance $e_1$ for example between 100 nm and 250 nm, for example of the order of 200 nm.

Insulating elements that will be called "dummies" in the form of insulating 140 based on the dielectric material 101, for example rectangular or square in shape, are inserted in the metallic zone 110. These insulating islands 140 are designed particularly to balance areas of the dielectric material 101 and the metal in the metallic zone 110 inside the insulating zone 100, to prevent dishing phenomena mentioned above that would be the result of an excessive area of metal relative to the area of insulating material.

For example, the insulating islands 140 may have a critical dimension or width $w_2$, for example between 240 nm and 600 nm, for example of the order of 480 nm. The spacing between the islands 140 of dielectric material may be equal to a distance $e_2$, for example between 100 nm and 250 nm, for example of the order of 200 nm.

The number and size of metallic islands may be selected as a function of the area and the geometry occupied by the dielectric material zone, to balance the areas of metallic material and dielectric material, while the number and size of insulating islands may be selected at least as a function of the area and geometry occupied by the metallic material zone, to balance the areas of the metallic material and the dielectric material.

Therefore the metallic and insulating islands may balance areas of these materials in each of the zones 100 and 110. The dimensions S and W are used to adjust the geometry of the islands and strips between two materials in order to result in identical or similar areas of insulating and metallic material.

The number and size of metallic islands 130 and insulating islands 140 made of a dielectric material may be selected such that the area of dielectric material and metallic material within the insulating zone 100 are approximately equal to or are less than 10% different from each other.

The space $e_2$ between two insulating islands 140 is the space for a line belonging to the metallic zone 110 that is preferably small enough to be similar to the typical width of component interconnecting lines (not shown in this figure) on the microelectronic device, for example one or several tens of nanometres, while having a chosen width greater than the manufacturing imprecision of such a line, for example of the order of several nanometres.

Figure 3A:
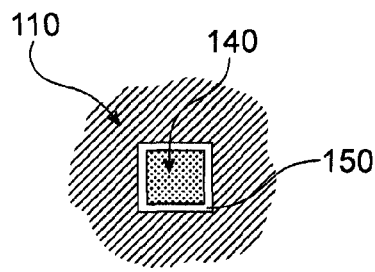
FIGS. 3A and 3B show a diffusion barrier layer around metallic and insulating islands in a test structure applied in a microelectronic device according to the invention.
Figure 3B:
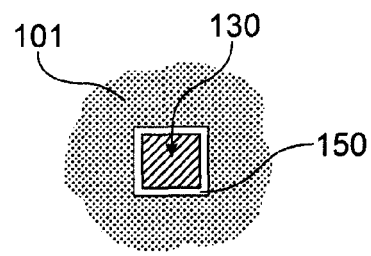

The space $e_2$ is also selected to be greater than the thickness of a diffusion barrier layer 150 (FIG. 3A) that in particular can be obtained between the metallic material of the zone 110 and the dielectric material 101 of the insulating islands 140. For example, such a barrier layer 150 may be based on TaN and may also be designed around the metallic islands 130 (FIG. 3B), and around the metallic zone 110. The thickness of the barrier layer 150 may for example be of the order of several nanometres. Such a barrier layer 150 is designed to prevent the metal in the metallic zone 101 from diffusing in the insulating zone 100 and in the insulating pads 140. Such a barrier layer 150 can also prevent the metal in the metallic pads 130 from entering the insulating zone 100.

To enable current to circulate homogenously in the second and third parts 100b and 100c of the metallic zone 100 included between a metallic voltage measurement portion 102 or 104 and a metallic current carrying portion 106 or 108, these parts 110b and 110c are selected such that their length $L_0$ (measured in a direction parallel to the vector $\vec{j}$ of an orthogonal coordinate system [O; $\vec{i}$; $\vec{j}$; $\vec{k}$] is preferably sufficiently large, for example of the order of 75 times $e_1$ for example of the order of 15 μm for example in the case in which $e_1$=200 nm.

The metallic portion 112 and the second part 110b of the metallic zone 110 may be long enough so that the current carrying zone corresponding to the total accumulated length of the portion 112, and the part 110b of the metallic zone is greater (for example at least 5 times greater) than the length Lb (shown in FIG. 2) of the part used for measuring the voltage and corresponding to the length of the central part 110a of the metallic zone 110, or the distance between the two metallic portions 116, 118 provided for the voltage measurement.

The central part 100a located between the metallic portions 106, 108 used as voltage measurement lines, may have a square or approximately square area, and a dimension that may for example be at least 5*e2+6*w2.

This description contains examples of test structure dimensions that can be adapted or modulated as a function of the production technology used, and particularly critical dimensions tolerated by this technology.

The equivalent resistance in terms of the number of squares can be calculated or determined using a simulation tool, for example using the "ANSYS MULTIPHYSICS" tool belonging to the ANSYS, Inc. Software company, and the result obtained is then:

$$R = \alpha * R \text{ square}$$

where R=resistance of the pattern measured by U/I,
α=pattern shape coefficient,
Rsquare=metal layer resistance.

A measurement process like that given in document by J. F. Guillaumond et al., Proc. of IITC 2003 conf., p. 132, is particularly suitable for the test structure that has just been described.

This parameter can be obtained starting from the measurement of the square resistance at two different temperatures, for example 30° C. and 80° C.:

$$\frac{(Rct2 - Rct1)}{(t2 - t1)} = \frac{\Delta\rho}{\Delta T} \times \frac{1}{e}$$

where Rct2 is a square resistance measurement made at temperature t2,
Rct1 is a square resistance measurement made at temperature t1, $$\frac{\Delta\rho}{\Delta T}:$$

the gradient of the resistivity as a function of the temperature,
e: the thickness of the metal extracted from this calculation.

This is used to make a precise measurement of the square resistance independently of mechanical-chemical polishing effects used in sub-micronic technologies.

The thickness and resistivity of the metal can also be extracted, because they are important parameters to be measured and monitored in manufacturing of circuits made using microelectronic technologies.

The previously described structure used to obtain these parameters from simple and fast automated electrical measurements, at the same time as other electrical measurements made during and at the end of manufacturing.

This test structure and the associated measurement method are suitable for tests during industrial manufacturing of microelectronic devices.

The invention claimed is:

1. Microelectronic device provided with one or several superposed metallic interconnecting levels, and at least one test structure comprising:
   at least one metallic zone formed from at least one insulating zone, the metallic zone comprising:
      at least one first metallic portion through which a current is aimed to be injected and at least one second metallic portion through which said current is aimed to be extracted,
      at least one third metallic portion that is aimed to act as a first voltage measurement point, and at least one fourth metallic portion that is aimed to act as a second measurement point for said voltage, a plurality of insulating islands incorporated in said metallic zone, said structure also comprising:

a plurality of metallic islands incorporated in the insulating zone and distributed around said metallic zone.

2. Microelectronic device according to claim 1, the number and size of metallic islands being selected at least as a function of the total surface area occupied by the insulating zone surrounding the metallic zone.

3. Microelectronic device according to claim 1, the number and size of the metallic islands and the insulating islands being selected such that the areas of the dielectric material and the metallic material within the insulating zone are equal to or are less than 10% different from each other.

4. Device according to claim 1, said insulating zone having an area of between 1.5 times and 2.5 times the area of the metallic area.

5. Device according to claim 1, the metallic islands and/or the insulating islands and/or said metallic zone being surrounded by a diffusion barrier layer.

6. A method comprising: measuring the resistance and/or the square resistance with the device of claim 1.

7. Method for estimating the thickness of at least one metallic interconnecting line comprising:

measuring at least one first square resistance at a first temperature, using at least one test structure according to claim 1, integrated into a microelectronic device comprising said interconnecting line, and measuring at least one second square resistance at a second temperature different from said first temperature and using said at least one test structure.

* * * * *